United States Patent [19]

Thomke et al.

[11] Patent Number: 4,636,037

[45] Date of Patent: Jan. 13, 1987

[54] ELECTRONIC DEVICE FOR PROCESSING AND DISPLAYING AN ITEM OF INFORMATION, A METHOD OF ASSEMBLING SAID DEVICE AND A MACHINE FOR CARRYING OUT THE METHOD

[75] Inventors: Ernst Thomke, Grenchen; Hans Zaugg, Derendingen, both of Switzerland

[73] Assignee: ETA S.A., Fabriques d'Ebauches, Grenchen, Switzerland

[21] Appl. No.: 654,449

[22] Filed: Sep. 26, 1984

[30] Foreign Application Priority Data

Oct. 14, 1983 [CH] Switzerland .................. 5610/83

[51] Int. Cl.⁴ .............................................. G02F 1/13
[52] U.S. Cl. ................................ 350/334; 350/331 R; 350/332
[58] Field of Search ..................... 350/331 R, 332, 334

[56] References Cited

U.S. PATENT DOCUMENTS

| | | | |
|---|---|---|---|
| 4,183,629 | 1/1980 | Nishimura et al. | |
| 4,455,185 | 6/1984 | Sasaki et al. | 350/334 X |
| 4,474,432 | 10/1984 | Takamatsu et al. | 350/332 X |
| 4,501,471 | 2/1985 | Culley et al. | 350/334 |
| 4,514,042 | 4/1985 | Nukii et al. | 350/334 X |
| 4,514,920 | 5/1985 | Shafrir et al. | 350/334 X |
| 4,515,440 | 5/1985 | Mosier | 350/334 |

FOREIGN PATENT DOCUMENTS

| | | |
|---|---|---|
| 2340666 | 2/1977 | France |
| 52-69646 | 6/1977 | Japan |
| 53-57874 | 5/1978 | Japan |
| 57-178220 | 2/1982 | Japan |

OTHER PUBLICATIONS

Electronics, vol. 47, No. 7 of Apr. 15, 1976, "Reels of Film Automate Watch Module Assembly".

*Primary Examiner*—John K. Corbin
*Assistant Examiner*—Richard F. Gallivan
*Attorney, Agent, or Firm*—Pollock, Vande Sande & Priddy

[57] ABSTRACT

An electronic device comprises three stacked flexible elements, namely an electronic assembly for processing information, a display cell for displaying such information and an electrical power source for powering the electronic assembly. The three elements are mechanically joined and electrically connected to each other by insulating and conductive adhesives. The device can be manufactured in quantity by unwinding strips of the three elements, joining the three strips in a stacked relationship, and separating the individual devices from the composite strip thus formed.

18 Claims, 8 Drawing Figures

ELECTRONIC DEVICE FOR PROCESSING AND DISPLAYING AN ITEM OF INFORMATION, A METHOD OF ASSEMBLING SAID DEVICE AND A MACHINE FOR CARRYING OUT THE METHOD

INDUSTRIAL FIELD OF THE INVENTION

The present invention concerns an electronic device for processing and displaying an item of information, a method of assembling said device and a machine for carrying out the method.

A device of the kind set forth above essentially comprises an electronic assembly which is intended to provide information, a display cell connected to the electronic assembly for displaying the information, and an electrical power source for powering the electronic assembly.

Such a device may constitute for example an electronic timepiece with digital or pseudo-analog display means. In that case, the electronic assembly comprises a time base circuit formed by an oscillator and a frequency divider, together with counters which supply time information in response to the signals supplied by the time base circuit. The display cell is then arranged in such a way as to display the time information which generally comprises at least the hours and minutes of real time. In very many cases, the electronic assembly and the display cell are so arranged that the seconds of real time are also displayed, as well as further items of information such as for example the date, the day of the week, a chronometrically measured period of time or an alarm time.

It will be apparent from reading the description set out hereinafter that the invention is not limited to the situation where the device is a timepiece but that it may be readily adapted to any situations in which information is processed by an electronic assembly, to be displayed by a display cell.

PRIOR ART

Devices of that kind, as known hitherto, usually comprise a rigid casing of metal or plastics material, in which are mounted the display cell, the electronic assembly and the electrical power source which is usually a battery. These elements are mechanically connected by a frame structure which is housed in the casing, and they are electrically connected by connecting elements.

The casing is usually closed by a bottom member and a glass through which the display cell is visible. Finally, manual control members, for example push buttons, are often disposed on the casing to permit control of various functions of the device, such as the time setting function if the device is a timepiece.

THE PROBLEM AND THE OBJECT OF THE INVENTION

In spite of all the simplifying modifications which have been made in the construction and manufacture of such devices, they are still fairly complicated and it is therefore not possible to produce such devices at very low cost. In addition, the known devices are generally fragile and are not fluid-tight, unless special steps are taken. Such special steps obviously increase the cost price of such devices.

Finally, the known devices are relatively heavy, especially when their casing is made of metal, and they are of fairly substantial thickness.

An object of the present invention is to provide a device of the kind defined hereinbefore which is at the same time very inexpensive, light, fluid-tight, not fragile, small in thickness and flexible.

Other objects of the present invention are to provide a method of assembling such devices and a machine for carrying out the method.

SUMMARY OF THE INVENTION

An electronic device for processing and displaying an item of information is, according to the invention, characterised in that it comprises three flexible elements. Each of these elements has two faces, and the three elements are disposed in such a way that at least one face of each element faces a face of another of the elements. Means are provided for mechanically connecting the three elements together. The three elements constitute respectively an electronic assembly for processing the information, a display cell for displaying the information, and an electrical power source for supplying power to the electronic assembly, and means are provided for electrically connecting the three elements together.

In preferred embodiments, the three elements may be arranged so that the electronic assembly is disposed between the display cell and the electrical power source, or so that the electrical power source is disposed between the display cell and the electronic assembly, or so that two of the elements are disposed on the same face of the third element. The means for mechanically connecting the elements together may comprise a layer of insulating adhesive. The means for electrically connecting the elements together may comprise a layer of conductive adhesive or a layer of a fusible metallic material.

Means may also be provided for manually modifying the information, such as, for example, an electronic circuit included in the electronic assembly, and first and second contact areas which are respectively connected to one of the terminals of the power source and to the electronic circuit and which are each disposed on respective ones of the elements so as to face each other and be normally separated and to come into contact with each other in response to a pressure applied to the device.

The device may be provided with means for fixing it in a position, such as, for example, a layer of self-adhesive material.

A method of assembling a device according to the invention is characterised in that the method comprises providing at least one of the three flexible elements with first means which can be transformed into the means for mechanically connecting the elements together, and providing at least one of the three flexible elements with second means which can be transformed into the means for electrically connecting the elements together, applying the elements against each other, and transforming the first and second transformable means respectively to produce the mechanical connecting means and the electrical connecting means.

In a preferred embodiment of the method, the flexible elements are produced in strips, each strip comprising a plurality of a respective one of the three elements, and means for enabling positioning of the elements relative to each other. A further strip may be produced comprising a plurality of fixing means, and these fixing means be applied to respective ones of the devices.

In an alternative preferred embodiment of the method, the elements are produced in the form of sheets each sheet comprising a plurality of a respective one of the three elements and means for enabling positioning of the elements relative to each other.

A machine for carrying out the method of assembling a device when the flexible elements are produced in strips has means for supporting the strips and means for applying the elements against each other. The machine may also have means for supporting a strip comprising a plurality of fixing means, the means for applying the elements against each other being so arranged as to also apply the strip of fixing means against one of the strips of elements.

The arrangement and connecting together of three flexible elements in a device according to the present invention allows an electronic device for processing and displaying an item of information to be provided which is inexpensive, light, fluid-tight, not fragile, thin and flexible.

Some examples of preferred embodiments of the invention will now be described in more detail with reference to the accompanying drawings.

DETAILED DESCRIPTION OF PREFERRED EMBODIMENTS

It should be noted that, in the accompanying drawings, the various elements of the device are shown as being of thicknesses that are selected on an arbitrarily large scale, in order to simplify comprehension of the drawings.

Figure 1:
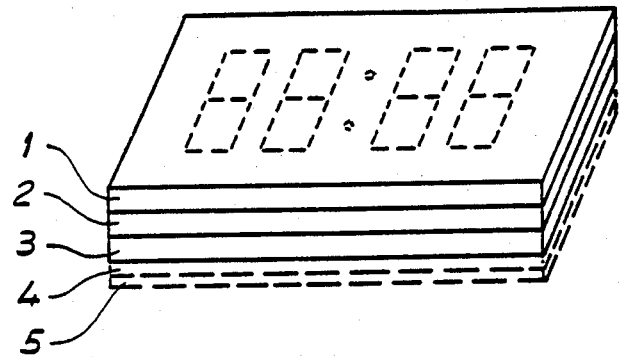
FIG. 1 is a schematic perspective general view of a preferred example of a device embodying the invention.
Figure 2:
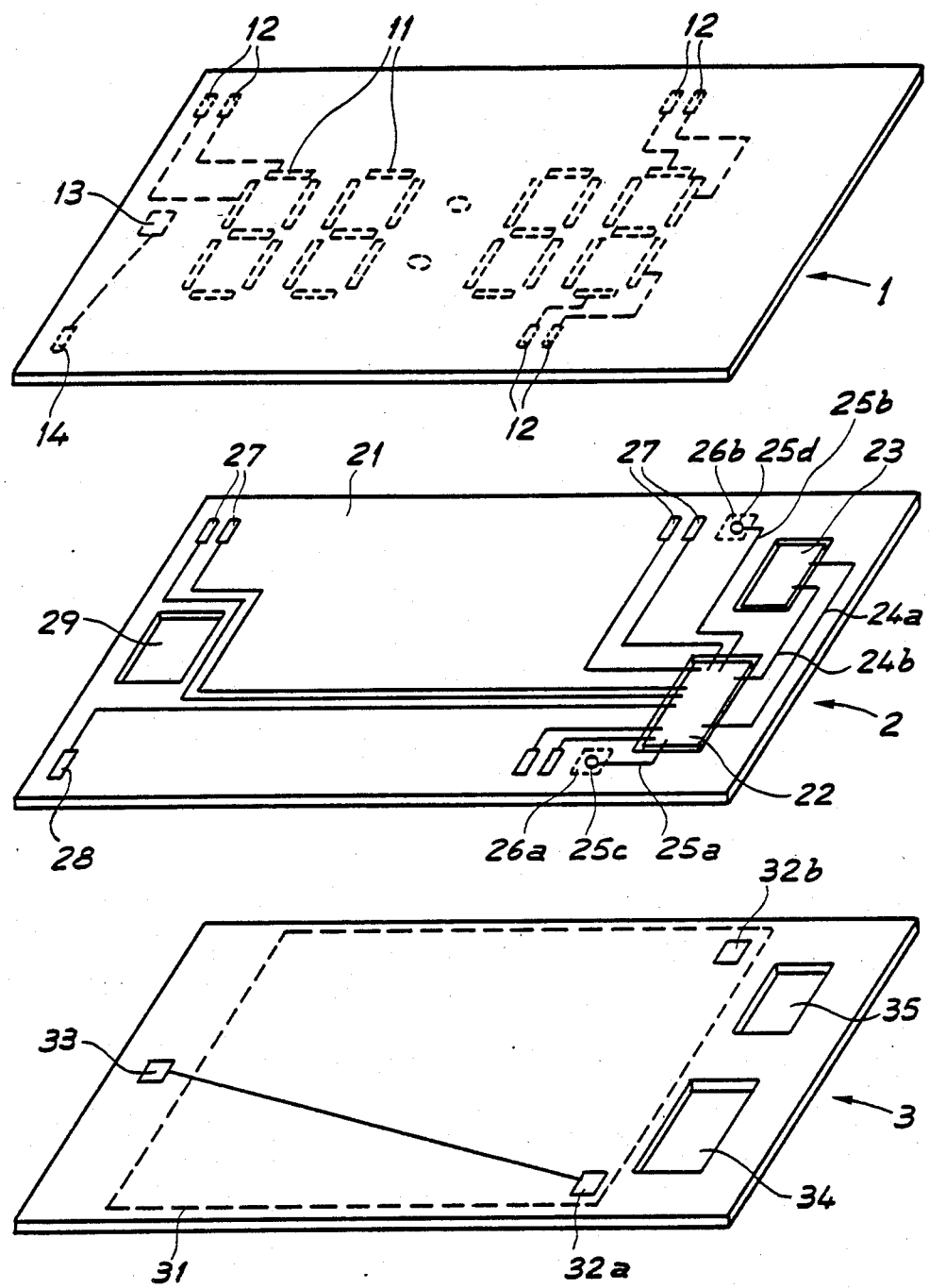
FIG. 2 is an exploded view of the device shown in FIG. 1.

The device illustrated by way of non-limiting example in a perspective view in FIG. 1 and in an exploded view in FIG. 2 is an electronic timepiece. It comprises a display cell 1, an electronic assembly 2 and an electrical power source 3.

Hereinafter in this description, the faces of the above-mentioned elements 1, 2 and 3, as well as those of the elements 1', 2' and 3' which will be referred to hereinafter, will be referred to as "upper" or "lower", according to whether they are facing upwardly or downwardly in the drawings, independently of the position of those faces in the finished device when fixed at the location at which it is to be used.

Thus, the upper face and the lower face of the display cell 1 are the faces which are respectively facing outwardly of the device and facing towards the electronic assembly 2; the upper and lower faces of the electronic assembly 2 respectively face towards the cell and towards the electrical power source 3; and finally, the upper and lower faces of the power source 32 respectively face towards the electronic assembly and outwardly of the device.

The display cell 1 is of the same kind as that which was described in communication No. 31 at the 56th Congress of the Societe Suisse de Chronometrie (Swiss Society of Chronometry) on 23rd and 24th Oct. 1981, presented by Messrs. Kikuyama et al, or in published British patent application GB No. 2 052 779A.

The cell 1 is a totally conventional liquid crystal display cell except for the sole difference that the two plates which define the cell and which surround the layer of liquid crystal comprise thin films of plastics material, for example a polyester or another polymer. Accordingly, the cell 1 is very thin and it has a certain degree of flexibility which permits it to be deformed without damage and without ceasing to operate. By way of example, the total thickness of such a cell may be about 0.2 mm.

The film forming the upper face of the cell is of course transparent although the other film may be transparent or opaque, according to circumstances. The two films and the layer of liquid crystal are not shown separately, in order not to complicate the drawing unnecessarily.

The cell 1 comprises, in the conventional manner, electrodes which are disposed on the inside faces of the two films of plastics material.

On one of those films, the electrodes are each in the shape of one of the display elements which are to be rendered visible or invisible in order to form the various digits, letters or other signs which are to be displayed. Such electrodes are commonly called control electrodes and they are shown in broken lines in FIGS. 1 and 2 because they are normally invisible. Some of the control electrodes are denoted by reference numeral 11 in FIG. 2.

The other film generally carries only one electrode which is disposed facing all the control electrodes and which is commonly referred to as the counter-electrode. The counter-electrode is not shown in the drawing, in order not to complicate it unnecessarily.

The display cell 1 could also comprise a plurality of counter-electrodes which are insulated from each other, a plurality of control electrodes each disposed in opposed relationship to another counter-electrode being then electrically connected. It will be appreciated that a device provided with such a display cell would not be a departure from the scope of the invention.

The control electrodes 11 and the counter-electrode are connected to the exterior of the display cell 1 by conductive paths and by connecting terminals disposed on the lower face of the cell 1, being therefore normally invisible in FIG. 2. In FIG. 2, some of the paths and the connecting terminals are shown in broken lines, with the terminals being denoted by reference numeral 12.

In the example shown in FIGS. 1 and 2, the control electrodes are disposed in conventional manner so that the cell 1 can display time information in digital form by means of four digits, and auxiliary information by means of two points or dots between the centre two digits. The two digits on the left serve to display hours while the two digits on the right serve to display minutes, with the two dots flashing for example at a frequency of 1 Hz.

It will be apparent that, in other devices embodying the invention, the control electrodes of the cell 1 could be disposed in a different way, so as to permit the display of time information or other kinds of information in any digital or non-digital form.

The electrodes could in particular be disposed parallel to each other or on the radii of one of more circles, so as to permit information to be displayed in a pseudo-analog form.

In the example shown in FIG. 2, the display cell 1 is also provided with a contact area 13 which is disposed on its lower face and which is electrically connected to a connecting terminal 14 which is also disposed on the same lower face. The purpose of the contact area 13 will be described hereinafter.

The electronic assembly 2 in FIGS. 1 and 2 comprises a printed circuit including a flexible insulating substrate 21 on which conductive paths are deposited in known manner. In order not to make the drawing obscure, only some of the conductive paths are shown in FIG. 2.

The electronic assembly 2 further comprises an integrated circuit 22 and a piezoelectric resonator 23. In the illustrated example, the integrated circuit 22 is so arranged as to perform the desired time measuring functions. In particular, it includes an oscillator circuit which is to be connected to the resonator 23 in order to constitute the time base circuit of the timepiece.

The various electronic circuits formed in the integrated circuit 22 will not be described herein as they are entirely conventional and are not related to the present invention. Moreover the electronic circuits differ according to the type of information that a device embodying the invention is to process and display. The resonator 23 could also be omitted or could be replaced by one or more other components such as a temperature, pressure or other sensor.

In the example illustrated, the integrated circuit 22 and the piezoelectric resonator 23 are housed in openings provided in the insulating substrate 21 in such a way that their upper face which carries their connecting terminals (not shown) is disposed substantially in the same plane as the upper face of the substrate 21.

The integrated circuit 22 conventionally comprises a silicon wafer in which the various electronic components, primarily transistors, are formed. The silicon wafer is encased in a protective layer which is usually of glass and whose upper face is provided with apertures in which the connecting terminals of the integrated circuit are disposed.

The piezoelectric resonator 23 comprises, also in conventional manner, a quartz resonator element which is encapsulated in a flat casing of ceramic or glass. On its upper face, the casing also carries the two connecting terminals of the resonator. As the integrated circuit 22 and the resonator 23 are thicker than the substrate 21, they project beyond tne lower face thereof.

The conductive paths of the printed circuit have been disposed on the substrate in such a way that one of their ends is disposed within the site of the apertures for receiving the integrated circuit 22 and the resonator 23. The apertures have then been cut out so that the above-mentioned ends remain and project beyond the edges of the apertures. The ends of the conductive paths are welded for example by thermo-compression to the terminals of the integrated circuit 22 and the resonator 23 after the circuit 22 and the resonator 23 have been placed in the apertures in the substrate 21. That technique is well known by the English expression "Tape Automated Bonding" (TAB) and will not be described in greater detail herein.

Two of the conductive paths which are denoted by references 24a and 24b connect the resonator 23 to the terminals of the integrated circuit 22 which, therein, are connected to the oscillator circuit.

Two other conductive paths which are denoted by references 25a and 25b have their first ends connected to the power supply terminals of the integrated circuit 22 and their second end connected to metallised holes 25c and 25d which pass through the substrate 21. The metallisation of the holes 25c and 25d is connected, on the lower face of the substrate 21, to connecting terminals 26a and 26b.

Other conductive paths of the printed circuit connect other terminals of the integrated circuit 22 to connecting terminals disposed in opposed relationship to the connecting terminals of the display cell 1. Only some of the conductive paths are shown and the corresponding connecting terminals are denoted by reference numeral 27.

Finally, one of the terminals of the integrated circuit, the function of which will be described hereinafter, is connected, still by way of a conductive path, to a connecting terminal 28 which is disposed in opposed relationship to the terminal 14 of the cell 1.

It is apparent that the integrated circuit 22, the conductive paths which connect its terminals to the connecting terminals 27 and 28, the connecting terminals 12 of the cell 1 and the conductive paths which connect them to the electrodes 11 are so arranged and disposed that the cell 1 correctly displays the information processed by the integrated circuit 22. In addition, the various connecting terminals which are disposed at the periphery of the elements 1 and 2 in the example illustrated in FIG. 2 could be disposed elsewhere on the lower and upper faces respectively of those elements.

Finally, the substrate 21 has therethrough an aperture 29 which is disposed in opposite relationship to the conductive area 13 of the cell 1. The function of the aperture 29 will be described hereinafter.

The above-described electronic assembly 2 is very thin. The thickness of the substrate 21 is from 0.2 to 0.3 mm and the thickness of the integrated circuit 22 and the resonator 23 are about 1.5 mm. The circuit 22 and the resonator 23 therefore project beyond the lower face of the substrate only by from 1.2 to 1.3 mm. As the substrate 21 is flexible, the electronic assembly 2 is also flexible.

The electrical power source 3 comprises a flat battery which includes for example a positive plate of stainless steel, a negative plate of zinc and an electrolyte, being zinc perchlorate in this example, which is contained in a porous separator disposed between the two plates. Such a battery was described more particularly on page 86 of No. 11 of the year 1979 of the journal "Funkschau".

The plates and the electrolyte of the battery are disposed between two thin sheets of plastics material or cardboard which are welded or glued together at their periphery. The sheets, plates and electrolyte are not shown separately in order not to complicate the drawing. The location of the plates is shown diagrammatically by a dash-dotted outline in FIG. 1.

The positive and negative terminals 32a and 32b of the battery are disposed on the upper face thereof, in opposed relationship to the connecting terminals 26a and 26b of the electronic assembly 2.

The upper face of the battery also carries a conductive area 33 disposed in opposed relationship to the area 13 of the display cell 1. The conductive area 33 is connected to the terminal 32a of the battery 3 by a conductive path.

Finally, the sheets which surround the components of the battery 3 have two apertures 34 and 35 therethrough, being of the same dimensions as the apertures formed in the substrate 21 of the electronic assembly 2 in which the integrated circuit 22 and the resonator 23 are disposed, and being positioned in opposed relationship thereto. The openings 34 and 35 are obviously disposed outside the region defined by the outline 32 where the active components of the battery are to be found.

As all the components of the battery 3 are very thin, the battery itself is also thin. Its thickness may be for example less than 1 mm. Such a battery has a certain degree of flexibility and can be deformed without ceasing to function.

Other types of thin flexible batteries are known, more particularly from the book entitled "High Energy Batteries" by M. R. Jasinski, published in 1967 by Plenum Press of New York, U.S.A. (pages 233 to 237), or the book entitled "Power Sources 2" by P. A. Boter et al, published in 1968 by Philips at Eindhoven, Netherlands (pages 364 and 365).

In the production of such batteries, the electrolyte is generally not brought into contact directly with the positive and negative plates. It may be stored in a closed chamber of glass or plastics material, disposed at a suitable location in the battery. When the battery is to be put into service, the closed chamber is broken for example by a pressure applied to the battery, thereby freeing the electrolyte which can thus come into contact with the plates.

The manufacture of the display cell 1, the electronic assembly 2 and the electrical power source 3, as such, will not be described herein as it is well known and is not directly related to the present invention.

Figure 3:
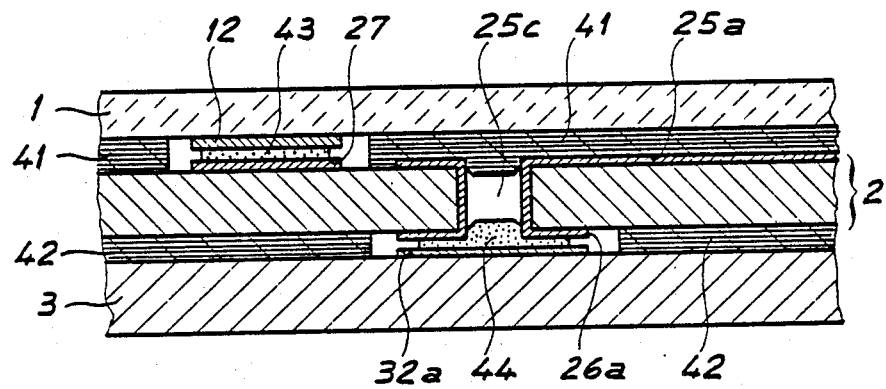
FIG. 3 is a view in cross-section of part of the device shown in FIG. 1.

One of the possible ways of assembling the display cell 1, the electronic assembly 2 and the electrical power source 3 to form the device shown in FIG. 1 is illustrated in FIG. 3, by way of non-limiting example.

FIG. 3 is a diagrammatic view in cross-section of part of the device shown in FIG. 1. The plane on which the section is taken, which is not shown, is perpendicular to the plane of the upper and lower faces of the device, being parallel to the longest side of those faces, and passing through the axis of the metallised hole 25c of the electronic assembly 2.

The components in FIG. 3 which are also shown in FIGS. 1 and 2 are denoted by the same references as those used in FIGS. 1 and 2.

Those details of the display cell 1, the electronic assembly 2 and the electrical power source 3 which would normally be visible in FIG. 3 but which do not play any part in the following explanation are not shown.

In this example, layers of a first liquid or pasty material which is intended to be transformed by a suitable treatment into a solid insulating adhesive are disposed for example by screen printing on the whole of the upper and lower faces of the electronic assembly 2, except for the regions where the connecting terminals 27, 28, 26a and 26b are disposed.

The first material may comprise for example a mixture of an epoxy resin and its hardener in the proportions prescribed by the manufacturer thereof.

Layers of a second liquid or pasty material which is intended to be transformed by a suitable treatment into a solid conductive adhesive are then disposed, also by screen printing, on the connecting terminals 27, 28, 26a and 26b.

The second material may comprise for example a mixture of an epoxy resin, its hardener and a metal powder.

The display cell 1 is then applied against the upper face of the electronic assembly 2 in such a way that its terminals 12 and 14 come into opposite relationship to the terminals 27 and 28 respectively.

Likewise, the electrical power source 3 is applied against the lower face of the electronic assembly 2 in such a way that its terminals 32a and 32b respectively come into opposite relationship to the terminals 26a and 26b and the integrated circuit 22 and the resonator 23 are engaged into the apertures 34 and 35.

The assembly which is formed in that way is then subjected to the necessary conditions for the two liquid or pasty materials which were deposited in the preceding step to be transformed into insulating solid adhesives as denoted by references 41 and 42 and conductive solid adhesives as denoted by references 43 and 44, respectively. Those conditions depend on the nature of the adhesives used and are prescribed by the manufacturers thereof.

It is apparent that the adhesives must preferably be so selected that the conditions of hardening thereof are at least substantially the same and that they are such that they do not give rise to the destruction of one or other of the various elements of the device.

After the adhesives have set, the device according to the invention is completed, without any other manufacturing operation.

The various elements of the device are mechanically connected by the layers 41 and 42 of insulating adhesive, which also prevent any undesired contact between the various conductive paths disposed on those elements, while the various connecting terminals are electrically connected by the layers 43 and 44 of conductive adhesive.

The device formed in that way is very thin. At its thickest point, that is to say, at the location of the integrated circuit 22 and the resonator 23, its thickness is for example less than 2 mm. All the elements thereof being flexible and the layers of adhesive being extremely thin, it is itself flexible and can be deformed without ceasing to function.

The device is also very light and fluid-tight and has a very good level of resistance to shocks. Finally, its cost price is very low.

It will be appreciated that the mode of operation of the above-described device depends on the kind of information that the electronic circuit 2 is to process and the cell 1 is to display. If the electrical power source 3 is already in service at the time of assembly of the device, the device begins to function as soon as the terminals 32a and 32b of the source 3 are connected to the terminals 26a and 26b of the electronic assembly 2, and the terminals 27 of the electronic assembly 2 are connected to the terminals 12 of the display cell 1. If the source 3 is not yet in service at the time of assembly of the device, it will be appreciated that the device cannot begin to function at that time, but only when the power source 3 is activated, for example by rupturing the container containing its electrolyte.

In many cases, the user of the device is to be able to correct or modify manually the displayed information.

In the particular example of the device shown in FIGS. 1 and 2 which is a timepiece, the integrated circuit 22 is so arranged as to carry out a time setting function in response to signals applied to that one of its terminals which is connected to the connecting terminal 28 of the electronic assembly 2. That terminal of the integrated circuit 22 is connected therein to the input of a time setting circuit of the kind described for example by U.S. Pat. No. 3,953,964. That time setting circuit, which will not be described in detail herein, is so arranged as to select one of the displayed items of information and to modify the selected information in response to the number and/or the period of application of a control voltage at its input. The control voltage is the voltage of one of the terminals of the power source of the circuit, for example the positive terminal. In the finished device, the above-mentioned input of the time setting circuit is connected to the contact area 13 by way of the corresponding terminal of the integrated circuit 22, the connecting terminal 28 and the connecting terminal 14. The contact area 13 is separated from the contact area 33 disposed on the electrical power source 3 by a distance equal to the thickness of the substrate 21 of the electronic assembly 2. When the user bears on the device in the region where the plates 13 and 33 are disposed, they come into contact by virtue of the flexibility of the various elements of the device and the presence of the aperture 29. As the contact area 33 is connected to the terminal 32a of the electrical power source 3, the voltage of the terminal 32a is therefore applied to the input of the time setting circuit of the integrated circuit 22. It will be appreciated that the terminal 32a is the terminal which supplies the voltage required for actuation of the time setting circuit. The time setting circuit therefore performs the functions for which it is provided in response to the pressures that the user applies to the device in the region of the contact areas 13 and 33.

It would be possible to provide in the integrated circuit 22 a more conventional time setting circuit comprising a plurality of control inputs, for example an input for selection of the digit to be corrected and a correction input in the proper sense. In such a case, it would be sufficient for example to increase the size of the contact area 33, to dispose the required number of contact areas similar to the area 13 on the cell 1, and to provide the corresponding conductive paths and connecting terminals on the cell 1 and on the electronic assembly 2. If necessary, the dimensions of the aperture 29 would have to be altered or a plurality of apertures similar to the aperture 29 would have to be provided.

In examples in which means for manual modification or correction of the information displayed are not required, as for instance when the display device is a thermometer or a barometer, the contact areas 13 and 33 and the aperture 29 are of course omitted.

It will be apparent that the operations for assembly of the device according to the invention may be performed in a different order from that described hereinbefore. The layers 43 and 44 of conductive adhesive may for example be deposited before the layers 41 and 42 of insulating adhesive. Likewise, those layers may be deposited firstly on a single one of the faces of the electronic assembly 2, the corresponding element being applied to that face before the layers of adhesive are deposited on the other face. In addition, the layers of adhesive could be deposited on the lower face of the display cell 1 and/or on the upper face of the electrical power source 3. In that case, it will be appreciated that no adhesive is to be deposited on the contact areas 13 and/or 33.

It would also be possible to replace the layers 43 and 44 of conductive adhesive by layers of fusible metallic material, for example tin solder, and to cause the fusible material to melt during the operation of hardening the layers of adhesive 41 and 42, or independently of the hardening operation.

The device may be fixed at the location at which it is to be used in a number of different ways.

It is possible for example to provide holes which correspond to each other in each of the three elements of the device and which permit it to be fixed to a bracelet, a chain or the like. It is also possible for the three elements of the device to be in the general form of a bracelet and to provide conventional clasp means at the ends thereof. By virtue of the flexibility of the sheets of plastics material and/or cardboard which constitute the carriers of those elements, such a bracelet-type device can be worn like a conventional wristwatch.

It is also possible for a layer of a self-sticking adhesive material which is protected by a sheet of paper or plastics to be deposited on the lower face of a device similar to that shown in FIGS. 1 and 2. At the moment of use, the protective sheet simply has to be removed, with the device being applied to the required location. The layer of self-sticking adhesive material and its protective sheet are shown in broken lines in FIG. 1, being denoted by reference numerals 4 and 5, with thicknesses which are selected at an arbitrarily large value.

The manufacture of each of the elements of the device, namely the display cell 1, the electronic assembly 2 and the electrical power source 3 may be carried out from continuous strips of thin cardboard or plastics material, and there is no need for the elements to be separated from each other at the end of manufacture thereof. Because of their flexibility, the strips can be wound around reels, after manufacture of the elements of the device, and the reels can be stored until the time arrives for assembly of the device.

There would thus be reels which respectively contain a large number of display cells, a large number of electronic assemblies and a large number of electrical power sources, in mutually adjoining relationship.

In addition, in the course of manufacture of such elements, the adhesives intended to join them together in the manner described hereinbefore may already be deposited at the required locations.

In order to prevent the adhesives from sticking the turns of the reels together, it is possible for them to be covered with a protective sheet, for example, of plastics material. It will be appreciated that the protective sheet is removed at the time of assembly.

To avoid that complication, it is possible for the layers 41 to 44 in FIG. 3 to comprise thermo-fusible adhesives which are solid at normal temperature and which have to be heated to a given temperature in order to function as an adhesive.

Figure 4:
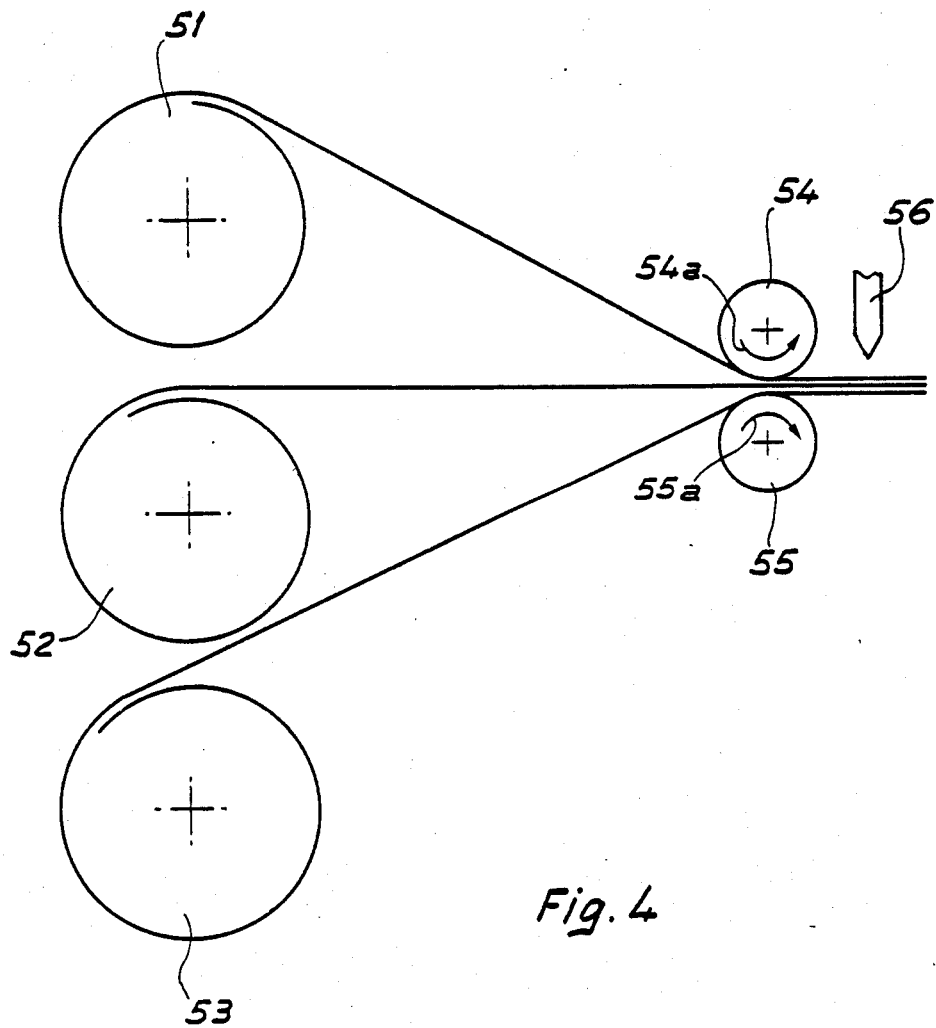
FIG. 4 is a diagrammatic view of a preferred example of a machine for assembling devices according to the invention.
Figure 5:
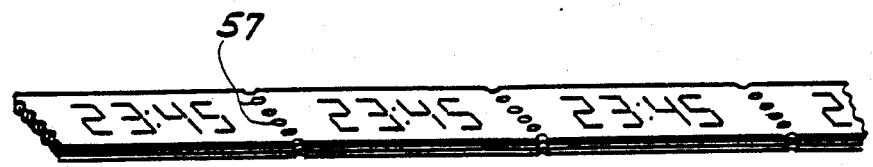
FIG. 5 is a perspective view of an array of devices assembled by means of the machine of FIG. 4.

FIG. 4 diagrammatically illustrates a machine for assembling devices according to the invention from elements which are produced in continuous strips and which are presented in the form of reels, while FIG. 5 shows some of the devices as they issue, also in the form of a continuous strip, from the machine.

In FIG. 4, references 51, 52 and 53 respectively denote the reels for storing the display cells, the electronic assemblies and the power source, which are produced in the form of continuous strips.

The assembly machine further comprises two rollers 54 and 55 for entraining the strips coming from the reels 51 to 53 by rotating in the directions indicated by the arrows 54a and 55a under the action of a drive member (not shown) and for applying the strips against each other.

If the adhesives deposited on the strips are of the thermofusible type, the above-mentioned rollers may be heated to a sufficient temperature to cause the adhesives to melt. As they cool, after being passed between the rollers 54 and 55, the adhesives solidify again and form the mechanical and electrical connections between the elements of the devices, as described hereinbefore.

It is also possible to dispose heat sources (not shown) upstream of the rollers 54 and 55, in the vicinity of the strips, to melt the thermo-fusible adhesives. In that case, it will be appreciated that there is no need for the rollers 54 and 55 to be heated. They may even be cooled in order to accelerate setting of the adhesives.

If other types of adhesives which require the presence of a sheet of plastics material or paper between the windings on the reels 51, 52 and/or 53 are used, it is possible for other reels (not shown) to be disposed between the reels 51, 52 and/or 53 and the rollers 54 and 55, with the protective sheets being wound onto the other reels.

It would also be possible not to deposit adhesive on the strips at the moment of production thereof and to position a suitable device (not shown) between the reels 51, 52 and 53, and the rollers 54 and 55, to deposit such adhesives at the required locations.

The electrical power sources which are intended to be assembled to the other elements of the device by means of a machine similar to that shown in FIG. 4 are preferably of the type referred to hereinbefore, wherein the electrolyte is contained in a fluid-tight container which has to be ruptured in order for the power source to begin to function. The assembly machine and in particular the rollers 54 and 55 are also arranged preferably in such a way as to avoid rupturing the above-mentioned containers. The devices when assembled, which issue from the machine in a continuous strip, may thus be wound onto reels and stored in an inoperative condition until they are put into service. At that moment, they can be separated from each other and the container containing the electrolyte of the electrical power source may be ruptured by a pressure or a twisting force applied to the device.

FIG. 5 shows devices in the form in which they issue in that case, in a continuous strip, from the assembly machine.

However, it is possible for the rollers 54 and 55 to be arranged in such a way that rupture of the containers of the power sources takes place at the time of assembly of the elements, with a mechanism being provided in the machine shown in FIG. 4, that comprises at least one knife and that is actuated synchronously with the rotary movement of the rollers 54 and 55 to separate the devices from each other. Such a separation mechanism is represented in FIG. 4, by a knife 56. The devices then issue from the assembly machine in the condition of being separated from each other and in an operable state.

The elements forming a device must be in properly defined relative positions when they pass between the rollers 54 and 55. This condition may be easily fulfilled by providing in each strip, between the successive elements and/or on the edge portions of the strips, holes which co-operate with teeth or claws (not shown) disposed on one or other of the rollers 54 and 55 for entraining the strips and for positioning the elements relative to each other.

It is moreover also possible to provide a drive mechanism which is independent of the rollers 54 and 55 and which uses the above-mentioned holes to entrain the three strips, while maintaining their relative positions with accuracy. Such a mechanism is not illustrated.

The positioning and entrainment holes which are shown in FIG. 5 and denoted by reference numeral 57 may also serve as a start for rupture or tearing to permit the devices to be separated from each other.

Finally, it will be appreciated that it is possible to provide the assembly machine shown in FIG. 4 with a fourth reel (not shown) which carries a strip of paper or self-sticking plastics material and its protective sheet. The self-sticking strip could thus be applied and fixed to the backs of the devices at the same time as they are assembled in the manner described hereinbefore.

In the strip of devices shown in FIG. 5, they are connected together at their small sides. It will be apparent that the devices can equally well be connected together at their long sides.

The production of each of the elements of the device may also be effected starting from sheets of thin cardboard or plastics materials of large dimensions, with the elements being disposed in a plurality of rows and a plurality of columns on the sheets. Large numbers of devices according to the invention can thus be manufactured simultaneously by disposing a sheet containing display cells and a sheet containing electrical power sources on respective sides of a sheet containing electronic assemblies. The assembly procedures, using for example glueing, are similar to those described above with reference to FIG. 3.

Figure 6:
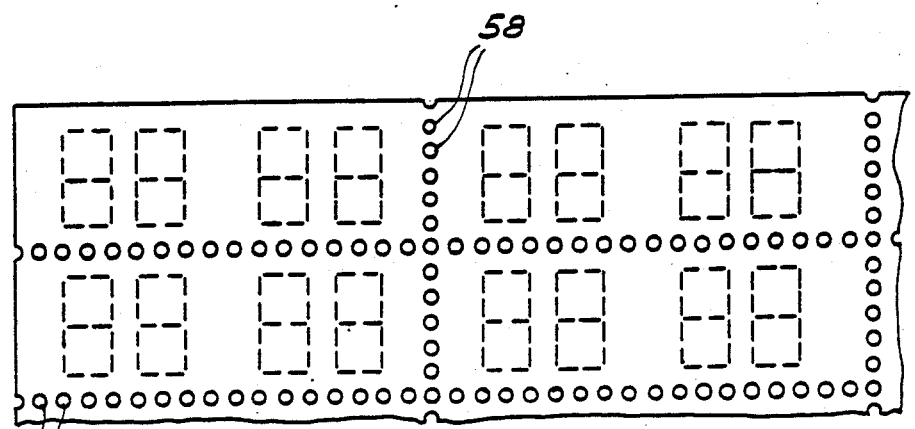
FIG. 6 is a plan view of another array of assembled devices.

FIG. 6 shows a part of an array of devices according to the invention which are produced in the manner described hereinbefore, before they are separated from each other, for example by being torn off along the holes denoted by reference numeral 58. The holes 58 also serve to provide for correct positioning of the various sheets at the moment at which they are assembled.

The elements 1, 2 and 3 forming the device are shown in FIGS. 1 and 2 as being of identical lengths and widths. It will be appreciated that such dimensions could be different from one element to another, without the device departing from the scope of the invention.

Likewise, the relative arrangement of the various elements of the device could be different from that shown in FIGS. 1 and 2.

Figure 7:
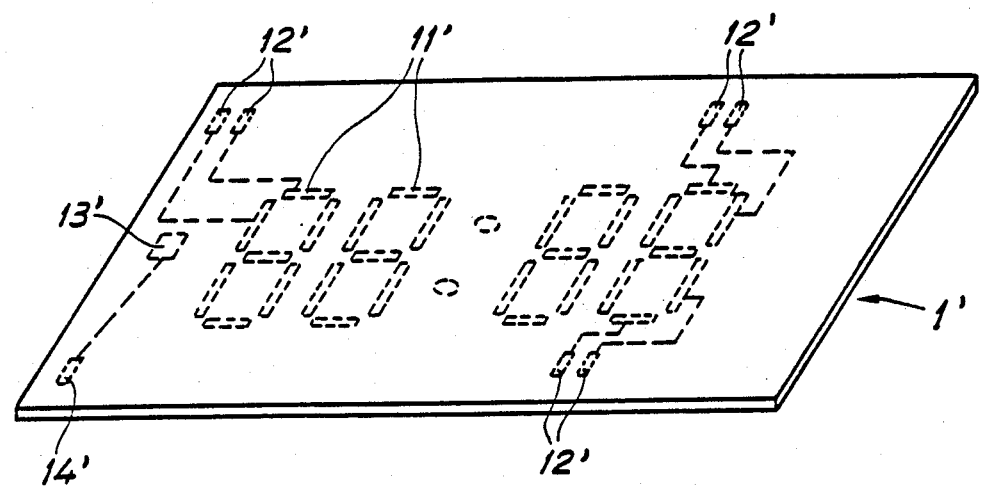
Figure 7:
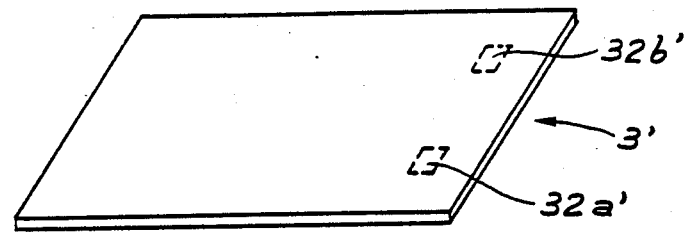
Figure 7:
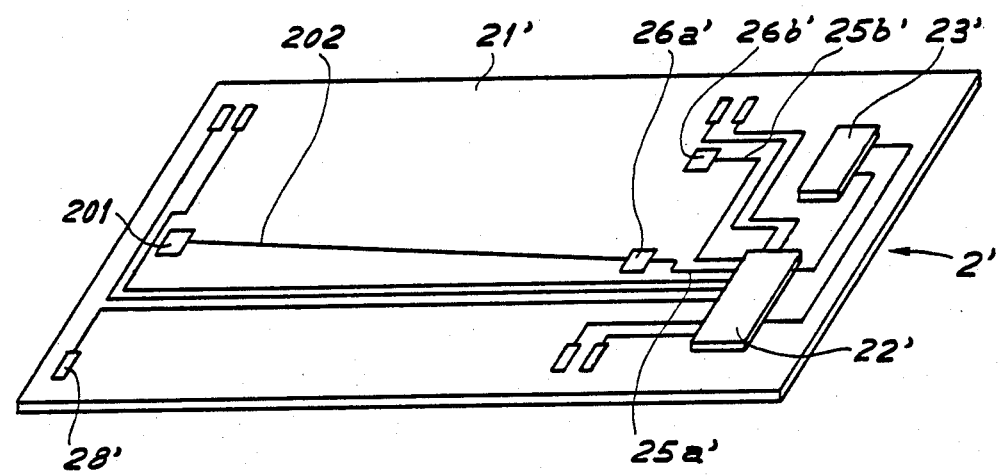

FIG. 7 shows by way of non-limiting example an exploded view of such a device wherein the electrical power source denoted by reference numeral 3' is disposed between the display cell and the electronic assembly which are respectively denoted by references 1' and 2'.

The display cell 1' will not be described here as it is identical to the cell 1 shown in FIG. 2. The various parts thereof, being denoted by reference numerals 11' to 14', respectively correspond to the parts 11 to 14 of the cell 1.

The electrical power source 3' is very similar to the source 3 shown in FIG. 2. In this embodiment, its width and its length are less than the width and the length of the cell 1' and the electronic assembly 2'. Its connecting terminals 32a' and 32b' are disposed on its lower face. In contrast to the source 3 shown in FIG. 2, it does not have any contact area connected to one of those terminals.

The electronic assembly 2' is also very similar to the assembly 2 shown in FIG. 2. It comprises a printed circuit formed by a substrate 21' bearing conductive paths, connecting terminals 27' which are disposed in opposite relationship to the terminals 12' of the display cell 1', and a connecting terminal 28' disposed in opposite relationship to the terminal 14' of the cell 1'.

The electronic assembly 2' also comprises an integrated circuit 22' and a piezoelectric resonator 23' which are similar to the corresponding components of the electronic assembly 2 in FIG. 2. However, the integrated circuit 22' and the resonator 23' are disposed on the substrate 21' and not in apertures provided therein. Their connecting terminals (not shown) are disposed on the lower face thereof, and are applied against the corresponding ends of the conductive paths and are connected thereto by any one of the processes which are well known in this art.

The power supply terminals of the integrated circuit 22' are connected by conductive paths 25a' and 25b' to connecting terminals 26a' and 26b' disposed on the upper face of the substrate 21' and not on its lower face as in the embodiment shown in FIG. 2, in opposed relationship to the terminals 32a' and 32b' of the electrical power source 3'. Thee electronic assembly 2' therefore does not have any metallised holes similar to the holes 25c and 25d of the electronic assembly 2 in FIG. 2.

In addition, the electronic assembly 2' comprises a contact area 201 which is disposed in opposed relationship to the contact area 13' of the display cell 1'. The contact area 201 is connected to the connecting terminal 26a' by a conductive path 202.

The operations of assembling and connecting the display cell 1', the electronic assembly 2' and the electrical power source 3' to produce a device according to the invention will not be described in detail here as they may be carried out in the same manner as in the embodiment illustrated in FIGS. 2 and 3, with the only difference that, in this embodiment, the electrical power source 3' is disposed between the display cell 1' and the electronic assembly 2'. The thickness of the electrical power source 3' generally being of the same order of magnitude as that of the integrated circuit 22' and the resonator 23', the assembled device is virtually flat.

If the integrated circuit 22' and the resonator 23' or one of the two thereof are markedly thicker than the electrical power source 3', they may be located in apertures (not shown) provided in the display cell 1'.

The mode of operation of the apparatus in the embodiment illustrated in FIG. 7 will not be described in detail here as it is identical to that of the device shown in FIGS. 1 and 2. As in the latter device, the user of the device may modify the information displayed by bearing on the display cell 3' in the region of the contact areas 13' and 201. The voltage of the terminal 32a' of the electrical power source 3' is thus applied to the input of the correction circuit of the integrated circuit 22' by way of the connecting terminal 26a', contact areas 201 and 13' and connecting terminals 14' and 28'.

In an alternative form of the example of a device embodying the invention as illustrated in FIG. 7, the integrated circuit 22' and the resonator 23' could be disposed, as in the embodiment in FIG. 2, in apertures provided in the substrate 21', with their connecting terminals disposed in the plane of the upper face of the substrate 21'. That alternative is not illustrated.

To permit the devices in accordance with the embodiment shown in FIG. 7 to be assembled by means of a machine similar to that shown in FIG. 4, it is sufficient for the sheets of cardboard or plastics material which surround the plates and the electrolyte of the electrical power source 3' to be of a length equal to the length of the display cell 1' and the electronic assembly 2'. In that case, it will be appreciated that apertures must be provided in the sheets of cardboard or plastics material, facing the integrated circuit 22' and the resonator 23', and also facing the contact areas 13' and 201.

Figure 8:
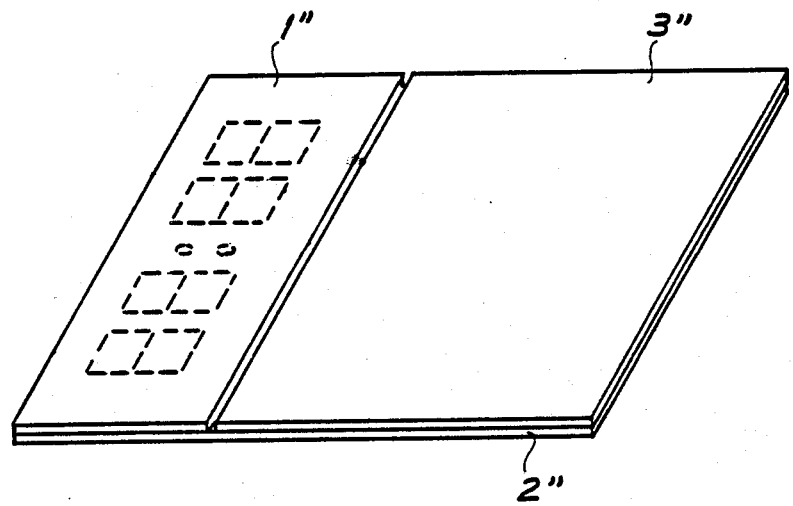
FIGS. 7 and 8 show other examples of devices embodying the invention.

It is also possible to arrange two of the elements of the device in side-by-side relationship on the same face of the third element. FIG. 8 is a diagrammatic view of such a device wherein the display cell and the electrical power source denoted by references 1" and 3" respectively are disposed in side-by-side relationship on one of the faces of the electronic assembly denoted by reference numeral 2". FIG. 8 will not be described in detail as the construction and assembly of the elements 1", 2" and 3" are evident in the light of the description set out hereinbefore.

It will be apparent that, irrespective of the construction thereof, a device embodying the invention may be fixed at the location at which it is to be used in any of the ways described in relation to the embodiment shown in FIGS. 1 and 2.

ADVANTAGEOUS EFFECT OF THE INVENTION

The invention provides an electronic device for processing and displaying an item of information, which device is thin, flexible, shock resistant, light and inexpensive to manufacture, and is capable of being fluid tight and manufactured easily in large numbers, being designed to facilitate the use of mass production methods, especially continuous mass production methods.

What is claimed is:

1. An electronic device for processing and displaying an item of information, the device comprising:
   three flexible elements each having two faces, said three elements comprising respectively:
   an electronic assembly for processing said information;
   a display cell for displaying said information;
   and an electrical power source for supplying power to said electronic assembly;
   said elements being so disposed that at least one face of each element is disposed facing a face of another element;
   means for mechanically connecting said elements together;
   and means for electrically connecting said elements together.

2. A device according to claim 1, wherein said electronic assembly is disposed between said display cell and said electrical power source.

3. A device according to claim 1, wherein said electrical power source is disposed between said display cell and said electronic assembly.

4. A device according to claim 1, wherein two of said elements are disposed on the same face of the third element.

5. A device according to one of claims 1, wherein said mechanical connecting means comprise a layer of insulating adhesive.

6. A device according to claim 5, wherein said electrical connecting means comprise a layer of conductive adhesive.

7. A device according to claim 5, wherein said electrical connecting means comprise a layer of a fusible metallic material.

8. A device according to claim 1, wherein it further comprises means for manually modifying said information.

9. A device according to claim 8, wherein said modifying means comprise an electronic circuit included in said electronic assembly and first and second contact areas which are respectively connected to one of the terminals of said power source and to said electronic circuit and which are each disposed on respective ones of said elements so as to face each other and be normally separated and to come into contact in response to a pressure applied to the device.

10. A device according to claim 1, wherein it further comprises means for fixing thereof.

11. A device according to claim 10, wherein said means for fixing thereof comprise a layer of a self-sticking material.

12. A method of assembling a device according to claim 1, wherein it comprises the steps of:
providing at least one of said elements with first means which are transformable into said mechanical connecting means and second means which are transformable into said electrical connecting means;
applying said elements against each other;
and transforming said first and second transformable means respectively to produce said mechanical connecting means and said electrical connecting means.

13. A method according to claim 12, wherein it comprises further providing said device with fixing means.

14. A method according to claim 12, wherein it further comprises producing said elements in the form of strips, each comprising a plurality of a respective one of said elements and means for enabling positioning of said elements relative to each other.

15. A method according to claim 14, wherein it further comprises producing a strip comprising a plurality of fixing means and applying said fixing means to said device.

16. A machine for carrying out the method according to claim 14, wherein it comprises means for supporting said strips and means for applying said elements against each other.

17. A machine according to claim 17, wherein it further comprises means for supporting a strip comprising a plurality of fixing means, said means for applying said elements against each other being so arranged as also to apply said strip of fixing means against one of said strips of elements.

18. A method according to claim 12, wherein it further comprises producing said elements in the form of sheets each comprising a plurality of a respective one of said elements and means for enabling positioning of said elements relative to each other.

* * * * *